(12) United States Patent
Zhang et al.

(10) Patent No.: US 10,734,984 B2
(45) Date of Patent: Aug. 4, 2020

(54) LATCH COMPARATOR CIRCUIT

(71) Applicant: NXP USA, INC., Austin, TX (US)

(72) Inventors: Bin Zhang, Suzhou (CN); Yan Huang, Suzhou (CN); Jianluo Chen, Suzhou (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/368,625

(22) Filed: Mar. 28, 2019

(65) Prior Publication Data

US 2020/0212902 A1 Jul. 2, 2020

(30) Foreign Application Priority Data

Dec. 26, 2018 (CN) .......................... 2018 1 1608068

(51) Int. Cl.
*H03K 5/24* (2006.01)
(52) U.S. Cl.
CPC .................................. *H03K 5/2481* (2013.01)
(58) Field of Classification Search
CPC ........................... H03K 5/2472; H03K 5/2481
USPC ........................................ 327/63, 64, 65, 67
See application file for complete search history.

(56) References Cited

U.S. PATENT DOCUMENTS

| | | | |
|---|---|---|---|
| 7,978,116 B2 | 7/2011 | Murden et al. | |
| 8,111,090 B2 | 2/2012 | Gebara et al. | |
| 8,143,921 B2 | 3/2012 | Neto et al. | |
| 8,198,920 B2 * | 6/2012 | Chatal .................. | G11C 27/024 327/205 |
| 8,773,169 B2 * | 7/2014 | Dinc ....................... | H03K 3/011 327/65 |
| 9,197,198 B2 | 11/2015 | Rajaee et al. | |
| 9,985,620 B2 | 5/2018 | Ihs | |
| 2001/0052870 A1 | 12/2001 | Nagaraj et al. | |
| 2008/0048731 A1 * | 2/2008 | Huang ............... | H03K 3/35613 327/65 |
| 2009/0167362 A1 * | 7/2009 | Hsien ....................... | H03K 5/24 327/64 |
| 2011/0115529 A1 * | 5/2011 | Jansson ................ | H03K 5/2481 327/90 |
| 2012/0153991 A1 * | 6/2012 | Cheong ............... | H03F 3/45744 327/63 |
| 2014/0062621 A1 * | 3/2014 | Dai ....................... | H03H 11/481 333/216 |
| 2014/0097871 A1 | 4/2014 | Hsu | |

FOREIGN PATENT DOCUMENTS

| | | |
|---|---|---|
| CN | 102957405 A | 3/2013 |
| CN | 106026996 A | 10/2016 |

* cited by examiner

*Primary Examiner* — William Hernandez (57) ABSTRACT

A latch comparator which includes a preamplifier and a latch circuit. The preamplifier circuit operates amplification on a pair of differential input signals, and generates a pair of pre-amplified differential signals. The latch circuit receives the pre-amplified differential signals, compares the pair of pre-amplified differential signals, and generates a pair of latched comparison signals. The latch circuit includes a latch and a switch circuit. First and second input terminals of the latch receive the pre-amplified differential signals. The switch circuit includes a switch coupling between one of the first and second input terminals of the latch and the preamplifier circuit. The switch receives one of the pair of latched comparison signals as a control signal, and is switched in response to the one of the latched comparison signal.

19 Claims, 4 Drawing Sheets

LATCH COMPARATOR CIRCUIT

BACKGROUND

The present invention generally relates to latch comparators and, more particularly, to a latch comparator that eliminates kickback noise.

Figure 1:
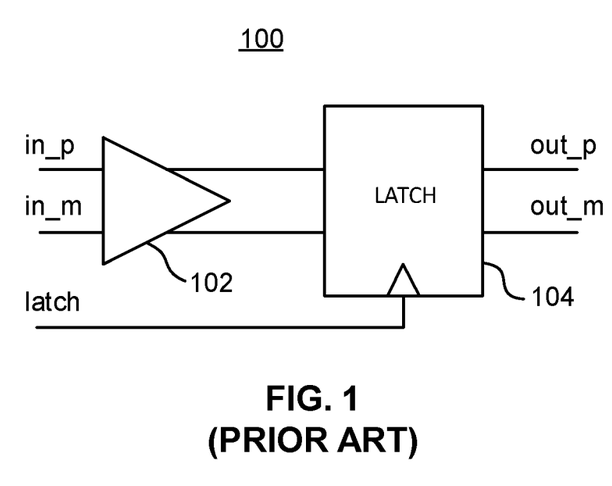
FIG. 1 is a schematic diagram of a conventional latch comparator.

Comparators are used in analog circuits and analog-to-digital (ADC) circuits. FIG. 1 shows a latch comparator 100 that includes a preamplifier 102 and a latch 104. The preamplifier 102 receives a differential input signal in_p, in_m and generates a pre-amplified differential signal that is provided to the latch 104. The latch 104 compares the pre-amplified signals and generates a latched differential signal out_p and out_m. The latch 104 also receives a latch signal at an enable terminal thereof. The latch signal configures the latch 104 to operate in a reset mode or a latch mode. In the reset mode, the output signals out_p and out_m are reset, and in the latch mode, the latch 104 functions as a normal latch circuit.

A main concern of the latch comparator 100 is the kickback effect, where the operation of the latch 104 impacts the operation of the preamplifier 102 such that the output of the preamplifier 102 may be affected, which can result in incorrect values being latched by the latch 104.

Accordingly, it would be advantageous to have a latch comparator that handles kickback effects.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a latch comparator that includes a preamplifier and a latch circuit. The preamplifier has first and second input terminals that a differential input signal. The preamplifier amplifies the differential input signal and generates a pre-amplified differential signal. The latch circuit is connected to the preamplifier circuit and receives the pre-amplified differential signal. The latch circuit compares the pre-amplified differential signals, and generates a pair of latched comparison signals. The latch circuit includes a latch and a switch circuit. The latch has first and second input terminals coupled to the preamplifier circuit for receiving the pre-amplified differential signal. The switch circuit includes a switch coupled between one of the first and second input terminals of the latch and the preamplifier circuit. The switch receives one of the pair of latched comparison signals as a control signal, and switches in response thereto.

In another embodiment, the present invention provides a method of latching and comparing a differential input signal. The method includes pre-amplifying the differential input signal and generating a pre-amplified differential signal, comparing, with a latch, the pre-amplified differential signals, and generating a differential latched comparison signal. A switch circuit receives one of the differential pair latched comparison signal, and switches the switch in response to the received one of the differential pair latch comparison signal.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 2:
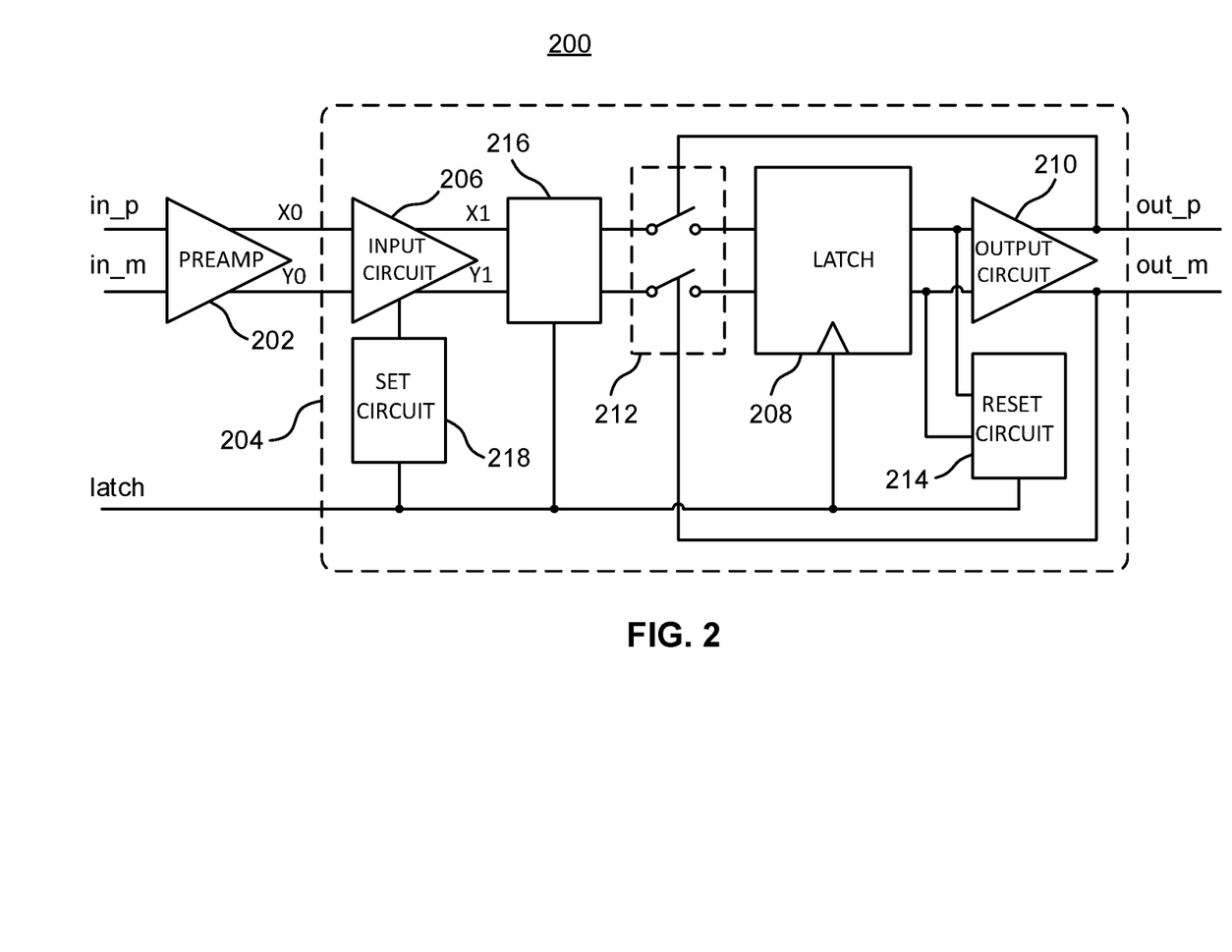
FIG. 2 is a schematic diagram of a latch comparator according to an exemplary embodiment of the present invention.

Referring now to FIG. 2, a latch comparator 200 according to an exemplary embodiment of the present invention is shown. The latch comparator 200 includes a preamplifier circuit 202 and a latch circuit 204. Similar to the preamplifier 102 of the latch 100 of FIG. 1, the preamplifier circuit 202 has first and second input terminals that receive a differential input signal in_p and in_m. The preamplifier circuit 202 amplifies the differential input signal in_p and in_m, and generates a pre-amplified differential signal. The latch circuit 204 is connected to the preamplifier circuit 202 and receives the pre-amplified differential signal. The latch circuit 204 compares pre-amplified differential signal, and generates a pair of latched comparison signals out_p and out_m as outputs of the latch comparator 200. The latch circuit 204 also receives a latch signal. The latch signal configures the latch circuit 204 to operate in either a reset mode or a latch mode, where the outputs out_p and out_m of the latch comparator 200 are reset in the reset mode.

The latch circuit 204 includes an input circuit 206, a latch 208, an output circuit 210, a switch circuit 212, a reset circuit 214, a conductor circuit 216, and a set circuit 218.

The input circuit 206 is connected to the preamplifier circuit 202 to receive the pre-amplified differential signal pair. The input circuit 206 performs level shifting (i.e., amplification) of the pre-amplified differential signal pair, and generates a level shifted signal pair, which is provided to the latch 208 by way of the conductor circuit 216 and the switch circuit 212.

The latch 208 has first and second input terminals that receive the level-shifted differential pair signals. The latch 208 generates a pair of latched comparison signals using the level-shifted differential pair signals. The output circuit 210 is connected to the latch 208 to receive the pair of latched comparison signals, and provides the latched comparison signals as outputs out_p and out_m of the latch comparator 200. Preferably, the output circuit 210 amplifies and delays the outputs of the latch 208 before the latched comparison signals out_p and out_m are provided.

The switch circuit 212 is coupled between the input circuit 206 and the latch 208, and also is connected to the output circuit 210. The switch circuit 212 receives the latched comparison signals out_p and out_m as control signals (i.e., for opening and closing the switches). In response to the latched comparison signals out_p and out_m, switches in the switch circuit 212 either close or open to conduct or cut-off connections between the input circuit 206 and the latch 208. FIG. 2 shows that the switch circuit 212 includes two switches respectively connected to the input terminals of the latch 208. However, in alternative embodiments, the switch circuit 212 includes one switch that connects to one of the input terminals of the latch 208. Since the latch comparator 200 receives a differential input signal (i.e., a differential signal pair), in applications where the switches in the switch circuit 212 are implemented by transistors receiving the latched comparison signals as gate control signals, two switch transistors in the switch circuit 212 respectively connected to one of the input terminals of the latch 208 ensure at least one of the switch transistors is cut off to prevent the voltage propagation into the preamplifier 202.

The reset circuit 214 is connected to output terminals of the latch 208. The reset circuit 214 also receives the latch signal, and, in response to the latch signal, resets the outputs of the latch 208 in the reset mode.

The conductor circuit 216 is connected between the input circuit 206 and the switch circuit 212. The conductor circuit 216 receives the latch signal, which indicates either the latch mode or the reset mode. In the latch mode, the conductor circuit 216 allows the level-shifted differential signal to be provided to the latch 208, and in the reset mode, the conductor circuit 216 prevents the transmission of the level-shifted differential signal to the latch 208.

The set circuit 218 is connected to the input circuit 206. The set circuit 218 receives the latch signal and in response to the latch signal, that is, in the reset mode, the set circuit 218 sets the outputs of the input circuit 206.

Figure 3:
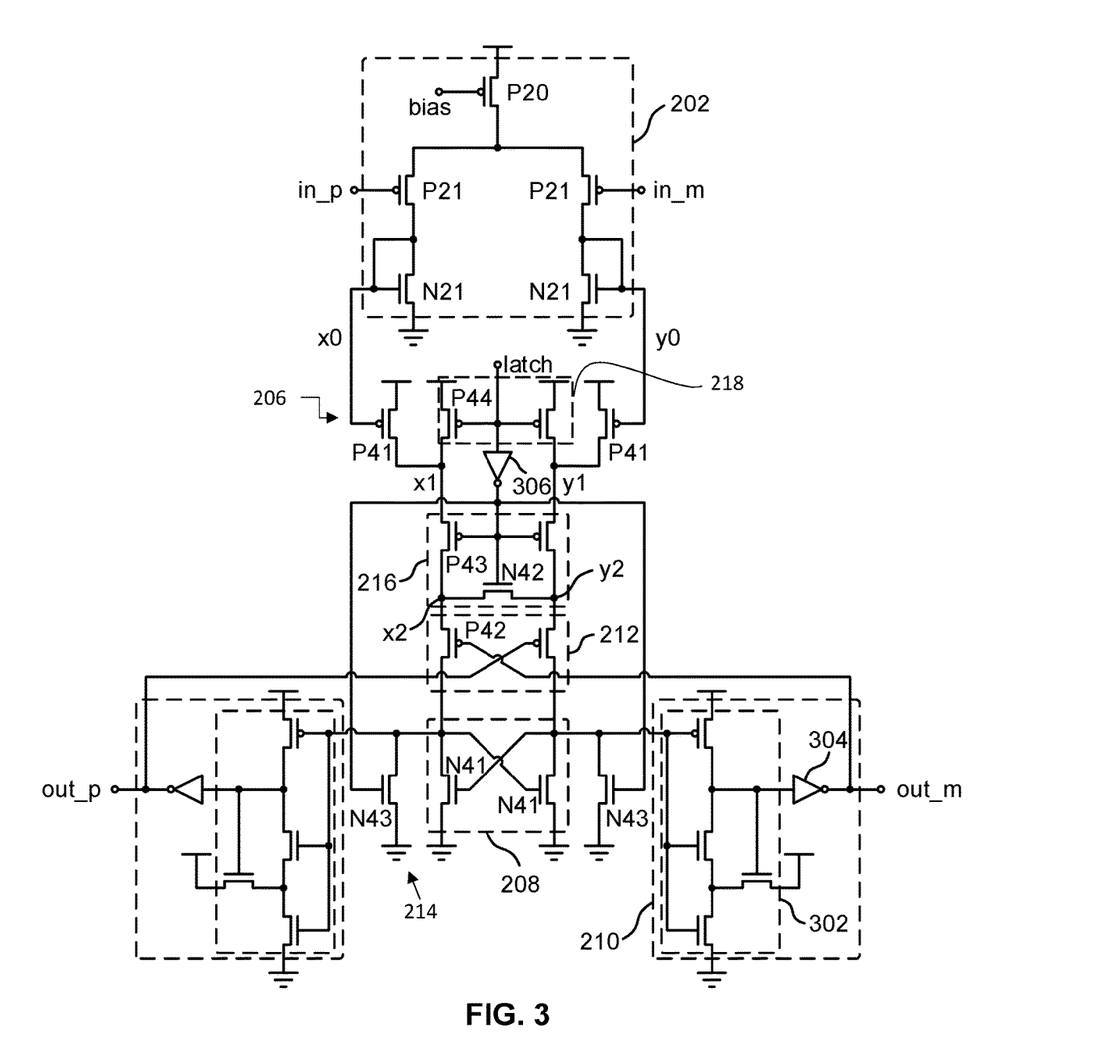
FIG. 3 is a schematic circuit diagram of the latch comparator of FIG. 2.

FIG. 3 depicts a circuit diagram of the latch comparator 200 of FIG. 2. The preamplifier circuit 202 includes a PMOS bias transistor P20, a pair of PMOS transistors P21 and a pair of NMOS transistors N21. The bias transistor P20 has a gate terminal that receives a bias signal, a source terminal connected to a supply voltage, and a drain terminal that provides a biasing current. The PMOS transistors P21 each have a gate terminal that respectively receive one of the pair of input signals in_p and in_m, a source terminal connected to the drain terminal of the bias transistor P20 to receive the biasing current, and a drain terminal connected to one of the pair of NMOS transistors N21. The drain terminals of the pair of PMOS transistors P21 provide the pair of pre-amplified differential signals.

Each of the NMOS transistors N21 has its gate connected to its source terminal and to the drain of a corresponding one of the pair of PMOS transistors P21. Drain terminals of the NMOS transistors N21 are connected to ground. Thus, the NMOS transistors N21 are diode-connected with respect to ground.

The input circuit 206 includes a pair of PMOS transistors P41. Each of the PMOS transistors P41 has a gate terminal connected to the drain terminal of a corresponding one of the pair of PMOS transistors P21 to receive one of the pair of pre-amplified differential signals. Each of the PMOS transistors P41 also has a source terminal connected to the supply voltage, and a drain terminal that provides one of the pair of level-shifted signals (X1, Y1) to the conductor circuit 216.

The latch 208 includes a pair of cross-connected NMOS transistors N41. The source terminals of the pair of NMOS transistors N41 operate as input terminals of the latch 208 and receive the level-shifted differential signal from the input circuit 206. The gate terminal of one of the NMOS transistors N41 is connected to the source terminal of the other one of the NMOS transistors N41. The latched comparison signal generated by the latch 208 is provided at the source terminals of the NMOS transistors N41. The drain terminals of the pair of the NMOS transistors N41 are connected to ground.

Each of the NMOS transistors N41 of the latch 208 is connected to a corresponding part of the output circuit 210. Since each of these corresponding parts is the same, only one is described here, where each part includes first and second inverters 302 and 304. The first inverter 302 is connected to the latch 208 to receive the latched comparison signal (i.e., one signal of the differential pair). In the embodiment shown, the first inverter comprises three series connected transistors that receive the latched comparison signal at their gates. A fourth transistor is connected to a pair of nodes located at points between the three series connected transistors. The second inverter 304 is connected to the first inverter 302 (by way of one of the nodes and the gate of the fourth transistor). The second inverter 304 provides at its output terminal the output signals out_p or out_m of the latch comparator 200. The first and second inverters 302 and 304 delay and amplify the latched comparison signal.

The switch circuit 212 includes a pair of PMOS transistors P42, each having a source terminal connected to the conductor circuit 216, a drain terminal connected to the latch 208 (i.e., to the source of transistor N41), and a gate terminal connected to the output of the second inverter 304 of the output circuit 210 to receive the output signal (out_p or out_m) as a control signal. The pair of PMOS transistors P42 thus are either conductive to cause an equal voltage level between the output terminals of the input circuit 206 (i.e. the drain terminals of the PMOS transistors P41) and the output terminals of the latch 208 (i.e. the source terminals of the NMOS transistors N41), or cut-off to cause unequal voltage levels.

The conductor circuit 216 includes a pair of PMOS transistors P43 and an NMOS transistor N42. Gate terminals of the pair of PMOS transistors P43 are connected to an inverter 306, which generates an inverted version of the latch signal. The source terminals of the pair of PMOS transistors P43 are connected to the input circuit 206, and the drain terminals of the pair of PMOS transistors P43 are connected to the source terminals of the pair of PMOS transistors P42 of the switch circuit 212. The gate terminal of the NMOS transistor N42 also receives the inverted version of the latch signal from the inverter 306. Then, the source and drain terminals of the NMOS transistor N42 are connected across the drain terminals of the pair of PMOS transistors P43.

In the reset mode, when the latch signal is low (i.e. a low logic state), the gates of the pair of PMOS transistors P43 in the conductor circuit 216 receive the inverted latch signal from the inverter 306, so the pair of the PMOS transistors P43 are cut-off, which prevents outputs of the input circuit 206 from being provided to the latch 208. However, since the inverted latch signal is high and is provided to the gate of the NMOS transistor N42, then transistor N42 is conductive, so the voltage levels on the output terminals of the latch 208 are kept equal.

On the other hand, in the latch mode when the latch signal is high, the inverted latch is low, so the PMOS transistors P43 are conductive, which allows the level-shifted differential signal X1, Y1 generated by the input circuit 206 to be provided to the latch 208.

The reset circuit 214 includes a pair of NMOS transistors N43, each of which has its gate connected to the output of the inverter 306 to receive the inverted latch signal, its source connected to the output terminal of the latch 208, which is the source terminal of the NMOS transistor N41, and its drain terminal connected to ground.

In the reset mode, when the latch signal is low, the inverted latch signal generated by the inverter 306 is high, and it is provided to the NMOS transistors N43, causing the NMOS transistors N43 to be conductive and pull the voltage on the output terminal of the latch 208 (i.e., the voltage at the source of N41) ground, such that the output signals out_p and out_m of the latch comparator 200 are reset (set to zero). The output signals out_p and out_m are fed back to switch circuit 212, which is to the gates of transistors P42.

The set circuit 218 includes a pair of PMOS transistors P44, which are connected to the output terminal of the input circuit 206. For each of the PMOS transistors P44, its gate receives the latch signal, its source is connected to the supply voltage, and its drain is connected to the drain of the PMOS transistor P41 of the input circuit 206.

In the reset mode, when the latch signal is low, the PMOS transistors P44 are conductive, and push the outputs of the input circuit 206 high. However, since the conductor circuit 216 is cut-off in the reset mode, the high state outputs from the input circuit 206 do not affect the outputs of the latch 208. In the latch mode, the PMOS transistors P44 are cut-off, so the input circuit 206 operates as normal and provides the outputs thereof to the latch 208.

Figure 4:
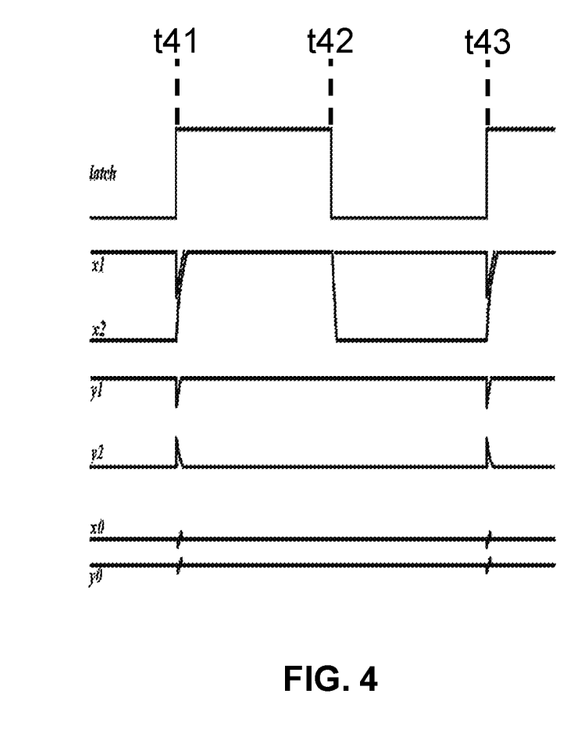
FIG. 4 is a waveform diagram illustrating waveforms of signals of the latch comparator of FIGS. 2 and 3.
Figure 5:
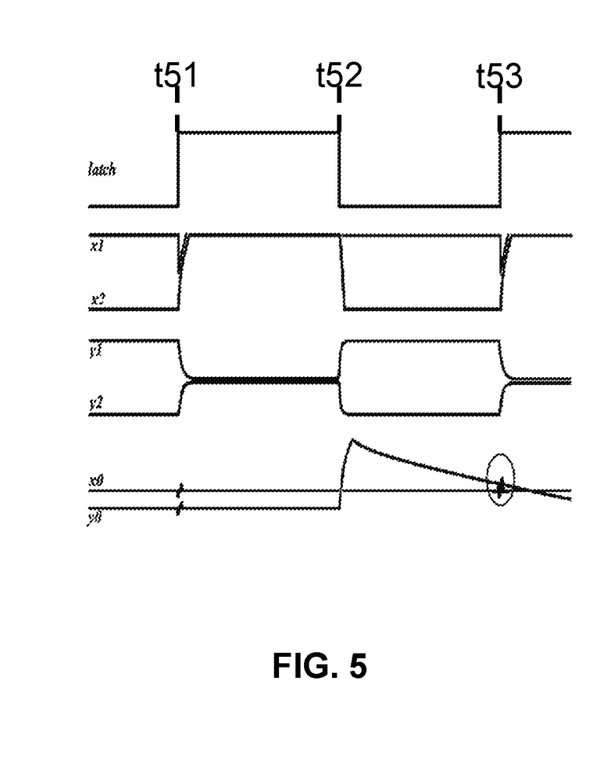
FIG. 5 is a waveform diagram illustrating waveforms of signals in a conventional latch comparator that does not include a switch circuit.

The operation of the latch comparator 200 of FIGS. 2 and 3 will be explained with reference to the signal waveforms shown in FIG. 4. For comparison, FIG. 5 shows the signals in a latch comparator that does not include the switch circuit 212 of FIGS. 2 and 3. The signals in FIGS. 4 and 5 are explained as:

| latch  | latching signal                                    |
|--------|----------------------------------------------------|
| x0, y0 | signals on output terminals of the preamplifier    |
| x1, y1 | signals on output terminals of the input circuit   |
| X2, y2 | signals on output terminals of the conduction circuit |

Referring to FIG. 5, in a first reset mode, before time t51, the set circuit 218 pushes the signals x1 and y1 on the output terminals of the input circuit 206 high. Because the reset circuit 214 pulls the output signals of the latch 208 down to low, and as noted above, FIG. 5 shows signals in a latch comparator that does not include the switch circuit 212, the signals on the output terminals of the conductor circuit are low.

In a first latch mode between time t51 and time t52, after the first reset mode, the differential pair input signals in_p and in_m are output by the preamplifer circuit 202 as X0 and Y0 and by the input circuit as X1 and Y1. Since the conductor circuit 216 is conductive in the latch mode and since FIG. 5 depicts signals in a latch comparator that does not include the switch circuit 212, the signals X1 and Y1 are output by the conductor circuit 216 as X2 and Y2.

For example, if the pre-amplified input signal x0 provided by the preamplifier 202 to the PMOS transistor P41 on the left side of the input circuit 206 is lower than the signal y0 provided to the right side PMOS transistor P41 (as differential signals, one is higher and one is lower), then the left PMOS transistor P41 will have a higher level of conduction than the right PMOS transistor P41, causing a current through the source of the left NMOS transistor N41 of the latch 208 to be higher than the current through the source of the right NMOS transistor N41. This higher current enables the voltage on the source terminal of the left NMOS transistor N41 to rise faster, and the right NMOS transistor N41 receives the faster rising voltage as the gate control signal goes conductive faster and presents a lower resistance, which pulls the voltage on the source terminal of the right NMOS transistor N41 even lower. Eventually, the latch 208 outputs a voltage of VDD (i.e. the supply voltage) at the left side, and a ground voltage at the right side. The voltage of the signal Y1 on the right-side output terminal of the input circuit 206 is slightly higher than the ground voltage and the voltage of the signal Y2, due to a voltage drop over the conducting PMOS transistor P43 of the conductor circuit 216.

At time t52, the reset mode is entered because the latch signal goes from high to low. As described above, the PMOS transistor P44 in the set circuit 218 turns conductive, which pulls the voltages of the signals x1 and y1 at the output terminals of the input circuit 206 high. For the right-side PMOS transistor P41 in the input circuit 206, the voltage on its drain terminal rises from a level slightly higher than the ground voltage to a level near the supply voltage VDD. Because the right-side PMOS transistor P41 has an inherent gate-drain capacitance Cgd, the voltage of the signal Y0 on it gate terminal, which is also the right-side output terminal of the preamplifier 202, ripples, as indicated in FIG. 5 in the circle after time t52. If a difference between the differential input signal pair low, the ripples can be relatively large with respect to such difference to cause the latch comparator 200 to be unable distinguish the difference, and thus possibly operate incorrectly. On the other hand, the pre-amplified differential signal Y0 of the preamplifier 202 takes time to recover from the ripples due to the capacitance Cgd. If the recovery time is not long enough such that the recovery is not finished before a next high-level latch signal comes, then the latch circuit 204 will operate incorrectly due to the ripple-affected pair of pre-amplified differential input signals X0 and Y0.

With reference to FIG. 4, in the present invention where the latch comparator 200 includes the switch circuit 212, the latch comparator 200 operates the same before time t41 in a first reset mode as that shown in FIG. 5. During this first reset mode, the switch transistors P42 in the switch circuit 212 are conductive in response to the received low-state latched comparison signals from the output circuit 210.

In a subsequent first latch mode between time t41 and time t42, the latched comparison signal out_p provided by the left NMOS transistor N41 of the latch 208 goes high, while the other latched comparison signal out_m provided by the right NMOS transistor N41 goes low. In response, the right PMOS transistor P42 in the switch circuit 212 receiving the high-level latched comparison signal out_p cuts off. The cut-off PMOS transistor P42 on the right side makes the signal voltage on the source terminal of the right NMOS transistor N41 in the latch 208 stay low, while the voltage of the signal Y1 on the right-side output terminal of the input circuit 206 gradually goes high because the right-side PMOS transistor P41 is to some degree conductive under the gate control signal Y0. On the other side, the low-state latched comparison signal received by the left switch transistor P42 conducts the left switch transistor P42, and has no impact on the operation of the left branch. As can be seen from FIG. 4, shortly after the time t41 and before the time t42, both of the signals X1 and Y1 go high. In the meantime, the signal X2 goes high and Y2 goes low (to ground level).

After time t42 and in a second reset mode between time t43 and time t42, the PMOS transistors P44 in the set circuit 218 become conductive to set the voltages of the signals X1 and Y1 to high. However, as described before, because the signal voltage on the right-side output terminal of the input circuit 206 is already high, there is no voltage change. Accordingly, there is no voltage ripple on the output terminals of the preamplifier 202 in the second reset mode.

As can be seen in FIG. 4, there is a minor ripple in the signal Y0 at the beginning of each latch mode, e.g. time t41 and time t43. This is because that the increasing output signal out_p cuts off the right-side PMOS transistor P42 in the switch circuit 212 while the signal Y1 is decreasing to ground. In response to the right-side PMOS transistor P42 cutting off, the signal Y1 shifts from decreasing, and starts to increase to the high state, as can be seen from the waveform of the signal Y1 around the time t41. The change in the signal Y1 on the drain terminal of the right-side PMOS transistor P41, like described with reference to FIG. 5, causes ripples in the pre-amplified differential signal Y0. However, the above-described change in the signal Y1 is rather mild because the signal Y1 itself is decreasing and does not reach the ground level before the right PMOS transistor P42 is cut off, which means the voltage change in the signal Y1 is relatively small from causing a large ripple in the signal Y0. Also, the pre-amplified differential signal Y0 is not used for a next cycle of comparison, which allows the signal Y0 almost the entire cycle of the latch signal to recover from the minor ripple.

The output circuit 210 introduces delays on the output signals generated by the latch 208 such that the switch transistors P42 are switched after the latched comparison signals from the latch 208 go towards the correct logic state. The introduced delays avoid the transistors P42 being switched before the normal operation of the latch 208 is finished.

The described embodiments use the example of the signal X0 being lower than the signal Y0. In alternative applications, the signal X0 may be higher than the signal Y0. The switch circuit 212 includes a pair of switch transistors P42 to cover both high-low relationships between the differential input signals in_p and in_m. Although the latch comparator 200 described in the above embodiments has a symmetric structure, in alternative embodiments where the latch comparator 200 receives a single signal (as opposed to a differential pair), the latch comparator may comprise only a left or a right half of the symmetric structure.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal". Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A latch comparator, comprising:
a preamplifier circuit that receives a pair of differential input signals (in_p, in_m) and generates a pair of pre-amplified differential signals (x0, y0);
a latch circuit connected to the preamplifier circuit and receiving the pair of pre-amplified differential signals, wherein the latch circuit compares the pair of pre-amplified differential signals, and generates a pair of latched comparison signals (out_p, out_m), wherein the latch circuit comprises:
a latch having first and second input terminals coupled to the preamplifier circuit for receiving the pair of pre-amplified differential signals; and
a switch circuit comprising a switch coupled between one of the first and second input terminals of the latch and the preamplifier circuit, wherein the switch receives one of the pair of latched comparison signals as a control signal, and switches in response to the received one of the pair of latched comparison signals.

2. The latch comparator of claim 1, wherein the latch circuit further comprises an input circuit coupled between the preamplifier circuit and the switch circuit, wherein the input circuit comprises first and second PMOS transistors (P41), wherein the first PMOS transistor has a gate connected to the preamplifier circuit for receiving a first one of the pair of pre-amplified differential signals, and the second PMOS transistor has a gate connected to the preamplifier circuit for receiving a second one of the pair of pre-amplified differential signals.

3. The latch comparator of claim 2, wherein the latch circuit further comprises a setting circuit connected to the input circuit, wherein the setting circuit receives a latch signal, and sets outputs of the input circuit in response to the latch signal.

4. The latch comparator of claim 1, wherein the latch comprises:
first and second NMOS transistors (N41), wherein:
source terminals of the first and the second NMOS transistors are connected to the switch circuit,
a gate of the first NMOS transistor is connected to the source of the second NMOS transistor,
a gate of the second NMOS transistor is connected to the source of the first NMOS transistor,
drain terminals of the first and second NMOS transistors are connected to ground, and
the source terminals of the first and second NMOS transistors provide the pair of latched comparison signals.

5. The latch comparator of claim 4, wherein the switch circuit is coupled between the source terminals of the first and second NMOS transistors and the preamplifier circuit, and the switch circuit receives the latched comparison signals provided by the first and second NMOS transistors.

6. The latch comparator of claim 5, wherein the switch circuit further comprises an additional switch coupled between the source terminal of the first NMOS transistor and the preamplifier circuit, wherein the additional switch receives the latched comparison signal provided by the second NMOS transistor as a control signal.

7. The latch comparator of claim 6, wherein the switch and the additional switch are PMOS transistors (P42) each having a gate terminal connected to receive the pair of latched comparison signals, a drain terminal connected to the first or second input terminal of the latch, and a source terminal coupled to the preamplifier circuit.

8. The latch comparator of claim 1, wherein the latch circuit further comprises a reset circuit connected to the latch, wherein the reset circuit receives a latch signal, and resets outputs of the latch in response to the latch signal.

9. The latch comparator of claim 1, wherein the latch circuit further comprises an output circuit connected to the latch, wherein the output circuit receives outputs of the latch and generates the pair of latched comparison signals.

10. The latch comparator of claim 9, wherein the switch is closed in response to the received one of the pair of latched comparison signals generated by the output circuit when the outputs of the latch are reset.

11. The latch comparator of claim 1, wherein the latch circuit further comprises a conductor circuit coupled between the switch circuit and the preamplifier circuit, wherein the conductor circuit receives a latch signal, and wherein:
the conductor circuit is closed in a latch phase of the latch circuit as indicated by the latch signal; and
the conductor circuit is open in a reset phase of the latch circuit as indicated by the latch signal.

12. The latch comparator of claim 11, wherein the conductor circuit comprises:
a PMOS transistor (P43) having a source terminal connected to receive one of the pair of the pre-amplified differential signals, a drain terminal connected to the switch circuit, and a gate terminal receiving an inverted version of the latch signal; and
an NMOS transistor (N42) having a gate terminal receiving the inverted version of the latch signal, and source and drain terminals respectively coupled with the first and second input terminals of the latch.

13. A method of latch comparing a pair of differential input signals in_p and in_m, comprising:

pre-amplifying the pair of differential input signals in_p and in_m to generate a pair of pre-amplified differential signals X0 and Y0;
comparing, by a latch, the pair of pre-amplified differential signals X0 and Y0, and generating a pair of latched comparison signals; and
receiving, by a switch of a switch circuit, one of the pair of latched comparison signals, and switching the switch in response thereto,
wherein the latch performs the steps of:
receiving, at a source terminal of a first NMOS transistor, a first one of the pair of pre-amplified differential signals passing through the switch circuit;
receiving, at a source terminal of a second NMOS transistor, a second one of the pair of pre-amplified differential signals passing through the switch circuit;
connecting a gate terminal of the first NMOS transistor to the source terminal of the second NMOS transistor, and connecting a gate terminal of the second NMOS transistor to the source terminal of the first NMOS transistor; and
providing the pair of latched comparison signals to the source terminals of the first and second NMOS transistors.

14. A method of latch comparing a pair of differential input signals in_p and in_m, comprising:
pre-amplifying the pair of differential input signals in_p and in_m to generate a pair of pre-amplified differential signals X0 and Y0;
comparing, by a latch, the pair of pre-amplified differential signals X0 and Y0, and generating a pair of latched comparison signals;
receiving, by a switch of a switch circuit, one of the pair of latched comparison signals, and switching the switch in response thereto;
the method further comprising:
receiving the pair of pre-amplified differential signals X0 and Y0 by an input circuit;
receiving a latch signal by a set circuit connected to output terminals of the input circuit; and
setting outputs at the output terminals of the input circuit, by the set circuit in a reset mode indicated by the latch signal.

15. The method of claim 13, wherein the switch receiving the one of the pair of latched comparison signals performs the steps of:
coupling the switch between the preamplifier circuit and the source terminal of the second NMOS transistor; and
providing the latched comparison signal from the source terminal of the first NMOS transistor to the switch as a control signal.

16. The method of claim 15, further comprising:
coupling an additional switch of the switch circuit between the preamplifier circuit and the source terminal of the first NMOS transistor; and
providing the latched comparison signal from the source terminal of the second NMOS transistor to the additional switch as a control signal.

17. A method of latch comparing a pair of differential input signals in_p and in_m, comprising:
pre-amplifying the pair of differential input signals in_p and in_m to generate a pair of pre-amplified differential signals X0 and Y0;
comparing, by a latch, the pair of pre-amplified differential signals X0 and Y0, and generating a pair of latched comparison signals;

receiving, by a switch of a switch circuit, one of the pair of latched comparison signals, and switching the switch in response thereto; and resetting outputs of the latch by a reset circuit connected to the latch, in response to a latch signal indicating a reset mode.

18. The method of claim 17, further comprising:
receiving, by an output circuit, outputs of the latch; and
the output circuit using the outputs of the latch to generate the pair of latched comparison signals.

19. A method of latch comparing a pair of differential input signals in_p and in_m, comprising:

pre-amplifying the pair of differential input signals in_p and in_m to generate a pair of pre-amplified differential signals X0 and Y0;

comparing, by a latch, the pair of pre-amplified differential signals X0 and Y0, and generating a pair of latched comparison signals;

receiving, by a switch of a switch circuit, one of the pair of latched comparison signals, and switching the switch in response thereto, the method further comprising:

saving the pre-amplified differential signals X0 and Y0 in the latch by a conductor circuit in response to a latch signal indicating a latch mode; and cutting off the pre-amplified differential signals X0 and Y0 from being provided to the latch by the conductor circuit in response to the latch signal indicating a reset mode.

* * * * *